(12) United States Patent
Wang et al.

(10) Patent No.: US 9,219,086 B2
(45) Date of Patent: Dec. 22, 2015

(54) IN-CELL TOUCH PANEL

(71) Applicant: Beijing BOE Optoelectronics Technology Co., Ltd., Beijing (CN)

(72) Inventors: Haisheng Wang, Beijing (CN); Xue Dong, Beijing (CN); Cheng Li, Beijing (CN); Xiaoliang Ding, Beijing (CN); Hongjuan Liu, Beijing (CN); Shengji Yang, Beijing (CN); Weijie Zhao, Beijing (CN); Yingming Liu, Beijing (CN); Tao Ren, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 32 days.

(21) Appl. No.: 13/967,952

(22) Filed: Aug. 15, 2013

(65) Prior Publication Data
US 2014/0048854 A1 Feb. 20, 2014

(30) Foreign Application Priority Data
Aug. 17, 2012 (CN) .......................... 2012 1 0295723

(51) Int. Cl.
*H01L 29/84* (2006.01)
*H01L 27/12* (2006.01)
(Continued)

(52) U.S. Cl.
CPC ............ *H01L 27/1255* (2013.01); *G06F 3/044* (2013.01); *G06F 3/0412* (2013.01)

(58) Field of Classification Search
CPC ................ H01L 2924/00; H01L 2924/00014; H01L 2224/48091; H01L 2224/32225; H01L 2224/16225; H01L 2224/73204; H01L 2924/3025; H01L 27/124; H01L 2224/45099; H01L 2224/48227; H01L 2224/73265; H01L 33/44
See application file for complete search history.

(56) References Cited

U.S. PATENT DOCUMENTS

2010/0302227 A1* 12/2010 Sasaki et al. .................. 345/211
2012/0154326 A1 6/2012 Liu
2013/0278557 A1 10/2013 Hotelling et al.

FOREIGN PATENT DOCUMENTS

| CN | 102339156 A | 2/2012 |
|---|---|---|
| CN | 102609128 A | 7/2012 |

(Continued)

OTHER PUBLICATIONS

Office Action issued by the Korean Patent Office for Korean Patent Application No. 10-2013-0097081 dated Aug. 28, 2014, 5pgs.
(Continued)

*Primary Examiner* — Julio J Maldonado
*Assistant Examiner* — Robert Bachner

(57) ABSTRACT

An embodiment of the disclosure discloses an in-cell touch panel having advantages such as a simple structure and a low cost. The in-cell touch panel comprises: a first substrate and a second substrate arranged oppositely, wherein a plurality of gate lines arranged horizontally are formed on the first substrate; the in-cell touch panel further comprises: a plurality of touch driving lines arranged horizontally; a plurality of touch sensing lines arranged vertically; and a plurality of touch scanning TFTs, wherein each touch scanning TFT has a gate connected to one gate line, a source connected to a touch driving circuit, and a drain connected to one touch driving line, the one gate line is only connected to the gate of one touch scanning TFT; wherein, the number of the gate lines≥the number of the touch scanning TFTs≥the number of the touch driving lines.

12 Claims, 7 Drawing Sheets

(51) Int. Cl.
*G06F 3/041* (2006.01)
*G06F 3/044* (2006.01)

(56) References Cited

FOREIGN PATENT DOCUMENTS

| CN | 202735997 U | 2/2013 |
|---|---|---|
| KR | 20100129145 A | 12/2010 |
| KR | 20110113650 A | 10/2011 |
| KR | 20110122727 A | 11/2011 |
| KR | 20120057403 A | 6/2012 |

OTHER PUBLICATIONS

English translation of Office Action issued by the Korean Patent Office for Korean Patent Application No. 10-2013-0097081 dated Aug. 28, 2014, 5pgs.

First Office Action (Chinese language) issued by the State Intellectual Property Office ("SIPO") on Dec. 15, 2014 for International Application No. 201210295723.X, 8 pages.

First Office Action (Korean language) issued by the Korean Patent Office for Korean Patent Application No. 012093120KR on Feb. 23, 2015, 5 pages.

English translation of first Office Action issued by Korean Patent Application for Korean Patent Application No. 012093120KR on Feb. 23, 2015, 4 pages.

English abstract of KR20110113650, 1 page.

English abstract of KR20110122727A, 1 page.

English abstract of KR20120057403A, 1 page.

* cited by examiner

IN-CELL TOUCH PANEL

CROSS REFERENCE TO RELATED APPLICATIONS

This application claims priority from Chinese National Application No. 201210295723.X filed on Aug. 17, 2012, the contents of which are incorporated herein by reference.

TECHNICAL FIELD

The present disclosure relates to a technical field of a touch display, particularly to an in-cell touch panel.

BACKGROUND

Touch panel as an input medium together with a display screen forms a touch display screen, and the touch display screen has gradually dominated in the field of display.

At present, the touch panel which is used widely includes an add-on touch panel which is attached outside of a display screen and an in-cell touch panel which is embedded in a display screen. For the add-on touch panel, the display screen and the touch panel are manufactured separately, and then they are bound together to form a touch display screen having touch and display functions.

As requirements for optical and electric properties of a flat display continuously increase, and needs from customer to make a flat display thinner, designing a ultra thin touch display screen with a high performance and a low cost without changing the technical process and the display effect, has became a main goal pursued by individual large manufacturers. Nevertheless, the existing add-on touch panel has disadvantages such as a complex structure, a high cost for manufacturing, a low light transmittance and a thicker module, et

SUMMARY

An embodiment of the disclosure discloses an in-cell touch panel having advantages such as a simple structure and a low cost.

The in-cell touch panel provided in the embodiment of the disclosure comprises: a first substrate and a second substrate arranged oppositely, wherein a plurality of gate lines arranged horizontally are formed on the first substrate; the in-cell touch panel further comprises: a plurality of touch driving lines arranged horizontally; a plurality of touch sensing lines arranged vertically; and a plurality of touch scanning Thin Film Transistors (TFTs), wherein each touch scanning TFT has a gate connected to one gate line, a source connected to a touch driving circuit, and a drain connected to one touch driving line, the one gate line is only connected to the gate of one touch scanning TFT; wherein, the number of the gate lines≥the number of the touch scanning TFTs≥the number of the touch driving lines.

In the embodiment of the disclosure, the in-cell touch panel includes the plurality of gate lines arranged in the horizontal direction, the plurality of touch driving lines set horizontally, and the plurality of touch sensing lines set vertically; and the in-cell touch panel further comprises: the plurality of touch scanning Thin Film Transistors (TFTs) corresponding to the gate lines one to one respectively; wherein the gate of each touch scanning TFT is connected to the gate line corresponding to the touch scanning TFT, and the source thereof is connected to the touch driving circuit, and the drain thereof is connected to one touch driving line. When a driving signal for realizing the display of image is applied to the gate line connected to the touch scanning TFT, the touch scanning TFT is turned on; then the touch driving signal is applied to the touch scanning TFT and the touch driving line connected to the drain of the touch scanning TFT is driven. In the technical solution of the embodiments of the disclosure, the time for scanning gate lines is utilized to control the time for scanning a touch driving line, so that the time for scanning one touch driving line is associated with the time for scanning one or more gate lines; meanwhile, since the touch driving lines are controlled by a specific touch driving circuit separately, the high frequency scanning for the touch driving lines can be achieved. The touch function of the in-cell touch panel is achieved by the electric field formed by the touch driving line to which the touch driving signal is applied and the touch sensing line. Thus, an in-cell touch panel with a simple structure and a low cost can be implemented.

BRIEF DESCRIPTION OF THE DRAWINGS

In following description, the features and advantages of the invention will be more apparent in connection with the appended drawings. In the whole drawings, the same element is denoted with the same reference number, wherein.

DETAILED DESCRIPTION OF THE PREFERRED EMBODIMENTS

To make the object, technical solution and advantageous of the present invention more clear, hereinafter, a detailed description will be further made to the embodiments of the present invention in connection with the appended drawings.

An embodiment of the present disclosure provides an in-cell touch panel which has advantages such as a simple structure and a low cost.

A capacitive touch panel includes a surface capacitive touch panel and a projective capacitive touch panel. The touch panel provided in the embodiment of the present disclosure is a projective capacitive touch panel.

The working principle of the projective capacitive touch panel is as follows: when the touch panel is touched, the magnitude of the electrostatic field emitted by electrodes of the touch panel is changed, and a touch point is located by a detecting apparatus detecting the changed amount of the electrostatic field. In particular, the electrodes of the touch panel in the in-cell touch panel comprise a plurality of touch driving lines and a plurality of touch sensing lines, wherein a high frequency voltage is applied to the touch driving line and a constant voltage is applied to the touch sensing line so that a projective electric field is formed between the touch driving line and the touch sensing line. The position where the touch point is located can be determined by detecting the change of the projective electric field at the touch point.

Figure 1:
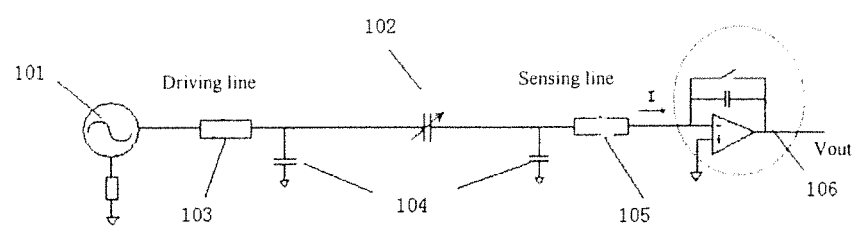
FIG. 1 is a schematic diagram showing an equivalent circuit model of a detecting apparatus for positioning a touch point in an in-cell touch panel provided in an embodiment of the present disclosure.

During the process that the detecting apparatus for positioning a touch point detects a touch point, the touch driving lines are scanned line by line; when each touch driving line is scanned, signals on all the touch sensing lines are read; by scanning the touch driving lines line by line, all the cross points of the touch driving lines and the touch sensing lines are scanned, so that the position of the touch point can be detected during the scanning process. Such a detecting mode for positioning a touch point can specifically determine coordinates of a plurality of points, and thus multi-touch can be realized. An equivalent circuit model of the detecting apparatus is shown in FIG. 1, and it comprises a signal source 101, a resistance of a touch driving line 103, a mutual capacitance 102 between a driving line and a sensing line, a parasitic capacitance 104 between the touch driving line and a common electrode layer, a parasitic capacitance 104 between the touch sensing line and the common electrode layer, a resistance 105 of the touch sensing line and a detecting circuit 106. When a finger touches the touch panel, a part of current flows into the finger, which is equivalent to a change of the mutual capacitance between the touch driving line and the touch sensing line, and thus a weak current change is detected at a detecting terminal.

In the in-cell touch panel provided in the embodiments of the disclosure, touch driving lines and touch sensing lines are arranged in the display screen, and each touch driving line is connected to one or more gate lines via one or more touch scanning Thin Film Transistors (TFTs), wherein one touch scanning TFT corresponds to one gate line, and one touch driving line can correspond to a plurality of touch scanning TFTs. Thus, when the gate lines corresponding to one touch driving line are turned on, a touch driving IC charges the touch driving line, i.e., inputs a touch driving signal. A touch function is realized by the touch driving line to which a touch driving signal is applied and the touch sensing line to which a constant voltage is applied.

Specifically, a plurality of touch scanning TFTs which corresponds to the gate lines one-to-one can be arranged in the peripheral area (non-display area) of an array substrate in a Liquid Crystal Display panel; each touch scanning TFT has a gate connected to a gate line corresponding to the touch scanning TFT, a source connected to a touch driving circuit, and a drain connected to a touch driving line. A touch driving signal is applied to or removed from the touch driving line connected to the touch scanning TFT by turning on or turning off the touch scanning TFT. The turning-on or turning-off of the touch scanning TFT is synchronized with the turning-on or turning-off of TFTs on the gate line for realizing the display of an image.

The touch driving circuit for applying a touch driving signal (a touch driving Clock signal) is independent of a display driving circuit for implementing the display of an image, and the frequency and magnitude of the touch driving Clock signal can be set according to actual requirements. The in-cell touch panel has advantages such as a simple structure, a thinner thickness, a simple technical process for manufacturing, and a low cost.

The technical solution provided in the embodiments of the disclosure is introduced as a whole hereinafter.

An in-cell touch panel provided in the embodiment of the disclosure comprises: a first substrate and a second substrate arranged oppositely, wherein a plurality of gate lines arranged horizontally are formed on the first substrate; the in-cell touch panel further comprises: a plurality of touch driving lines arranged horizontally; a plurality of touch sensing lines arranged vertically; and a plurality of touch scanning TFTs, wherein each touch scanning TFT has a gate connected to one gate line, a source connected to a touch driving circuit, and a drain connected to one touch driving line, the gate line is only connected to a gate of one touch scanning TFT; wherein, the number of the gate lines≥the number of the touch scanning TFTs≥the number of the touch driving lines.

In an example, each touch driving line is connected to one or more touch scanning TFTs via the drain(s) of the one or more touch scanning TFTs.

In an example, the gate lines corresponding to a plurality of touch scanning TFTs connected to one touch driving line are adjacent to each other.

In an example, the in-cell touch panel further comprises a plurality of data lines arranged vertically on the first substrate; the plurality of touch driving lines are located on the first substrate, and are arranged on the same layer as the data lines; each of the plurality of touch driving lines comprises a plurality of driving segments between two adjacent data lines; the driving segments located on the both sides of the same data line are connected to each other by through hole bypass; and the plurality of touch sensing lines are located on the second substrate.

In an example, the touch scanning TFTs are arranged in the non-display area of the first substrate, i.e., in the peripheral area.

In an example, the in-cell touch panel further comprises: a plurality of touch driving electrode units arranged vertically, wherein each of the plurality of touch driving electrode units includes one or more touch driving electrodes, and each of the touch driving electrode units is connected electrically to one touch driving line, the touch driving electrode unit is arranged between two adjacent columns of pixel units.

In an example, the gap between the adjacent touch sensing lines is opposite to the touch driving electrode unit on the first substrate; each of the touch sensing lines is opposite to one or more columns of pixel units.

In an example, within each of the plurality of the touch driving electrode units, a plurality of adjacent touch driving electrodes are electrically connected to each other via a metal wire having the same width as the gate line or the data line.

In an example, the length of each touch driving electrode unit can be 10 μm~150 μm.

In an example, the width of each touch driving electrode unit is equal to the width of a sub-pixel unit on the array substrate.

In an example, each touch driving electrode is located between the gate lines corresponding to two sub-pixel units adjacent to each other vertically.

In an example, the touch driving circuit connected to the source of each touch scanning TFT and the driving circuit for driving the gate lines to realize the display of an image are arranged in an integrated chip IC.

Next, the technical solutions provided in the embodiments of the disclosure are illustrated in detail with reference to the accompanying drawings.

Figure 2:
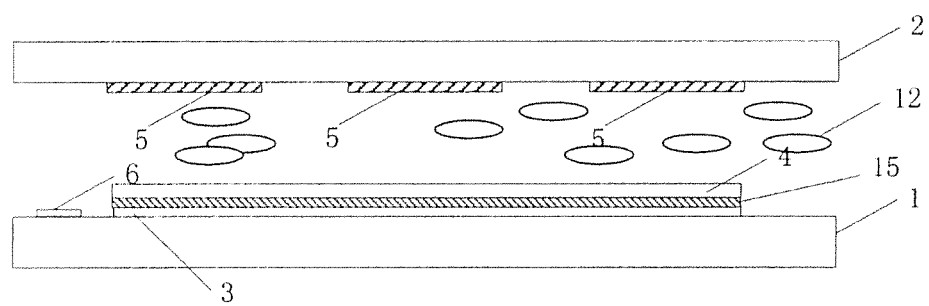
FIG. 2 is a schematic diagram showing a structure of the in-cell touch panel provided in the embodiment of the present disclosure.

With reference to FIG. 2, the in-cell touch panel provided in the embodiment of the present disclosure comprises: a first substrate 1 and a second substrate 2 arranged oppositely, wherein a plurality of gate lines 3 arranged horizontally are formed on the first substrate 1; the in-cell touch panel further comprises: a plurality of touch driving lines 4 arranged horizontally; a plurality of touch sensing lines 5 arranged vertically; and a plurality of touch scanning TFTs 6, wherein each touch scanning TFT 6 has a gate connected to one gate line 3, a source connected to a touch driving circuit (not shown in FIG. 2), and a drain connected to one touch driving line 4, the gate line 3 is only connected to a gate of one touch scanning TFT 6; wherein, the number of the gate lines≥the number of the touch scanning TFTs≥the number of the touch driving lines.

For instance, m gate lines, n touch scanning TFTs 6 and 1 touch driving lines can be arranged, wherein m, n, and l are positive integers. There are several cases as follows:

when m=n and n=l, each gate line is connected to one touch scanning TFT, and each touch driving line is connected to one touch scanning TFT; that is, the gate line, the touch scanning TFT and the touch driving line corresponds to each other one to one;

when m=n and n>l, each gate line is connected to one touch scanning TFT, and each touch driving line is connected to a plurality of touch scanning TFTs; that is, one touch driving line corresponds to a plurality of touch scanning TFTs, and each of the plurality of touch scanning TFTs correspond to one gate line respectively;

when m>n and n>l, one touch scanning TFT is connected to one gate line, and each touch driving line is connected to a plurality of touch scanning TFTs; that is, some gate lines are not connected to the touch scanning TFT.

The gate lines which are not connected to the touch scanning TFTs are only used for realizing the display of an image, and the gate lines connected to the touch scanning TFTs are used for realizing both the display of an image and the touch function.

Wherein, the gate of the touch scanning TFT 6 can be set as an independent structure connected to the gate line 3 directly, and the touch scanning TFT 6 can be also directly manufactured on the top of the gate line 3 and the gate line 3 can be directly utilized as the gate of the touch scanning TFT 6.

As shown in FIG. 2, taking a touch panel embedded in a Liquid Crystal Display (LCD) as an example, liquid crystal 12 is filled between the first substrate 1 and the second substrate 2, and the gate line 3 and the touch driving line 4 are isolated via an isolating layer 15.

Figure 3:
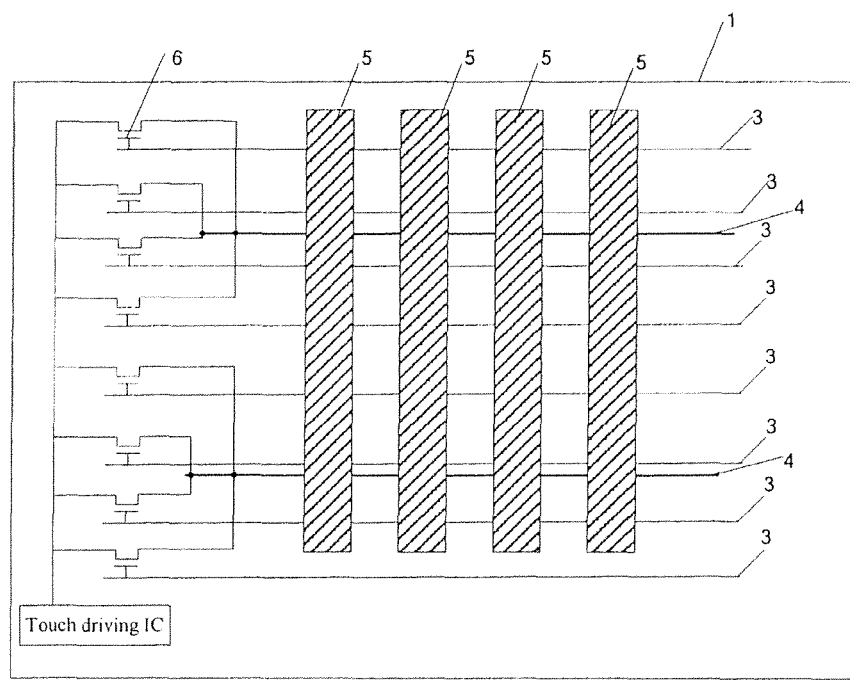
FIG. 3 is a schematic top view of the in-cell touch panel provided in the embodiment of the present disclosure.

FIG. 3 is a top view of the in-cell touch panel shown in FIG. 2.

On the first substrate 1 shown in FIG. 3, there are included a plurality of gate lines 3 arranged horizontally, a plurality of touch driving lines 4 arranged parallel to the gate lines 3, a plurality of TFTs 6 connected to the plurality of gate lines 3 respectively, a touch driving IC connected to all the TFTs 6, and a plurality of touch sensing lines 5 on the first substrate 1 or the second substrate 2 arranged vertically with regard to the plurality of touch driving lines 4. In an actual manufactured touch panel, the plurality of touch sensing line 5 can be a conductive bar with a certain width.

The touch scanning TFT 6 is located in the peripheral area of the first substrate 1 (the peripheral area refers to the non-display area on the display panel), and since the TFT 6 is connected to a gate line, the TFT 6 is normally arranged on the first substrate 1 close to a leading-out position of the gate line.

The principle of the in-cell touch panel shown in FIG. 2 and 3 to achieve a touch function is briefly introduced hereinafter.

In a specific implementation, a constant voltage is applied to a touch sensing line 5, and a touch driving signal is applied to the touch driving line 4 via a touch driving circuit connected to the touch driving line 4, wherein the touch driving signal is a high frequency signal. An electric field is formed between the touch driving line 4 and the touch sensing line 5, and the electric field is referred to as a projective electric field; a touch point is located by detecting the change of the projective electric field of the area where the touch point is located.

The touch driving circuit is arranged in a touch driving IC.

Figure 4:
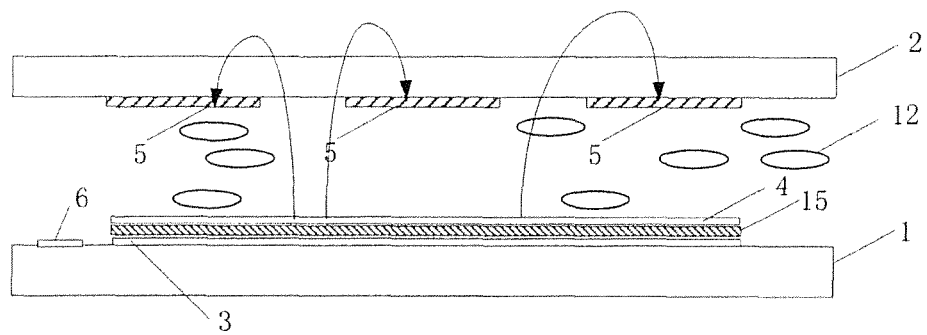
FIG. 4 is a schematic diagram showing a projective electric field in the in-cell touch panel provided in the embodiment of the present disclosure.

As shown in FIG. 4, an electric field is formed between the touch driving line 4 and the touch sensing line 5, wherein the curve with an arrow indicates the direction of the electric field line. From FIG. 4, it can be seen that there is a gap between adjacent touch sensing lines 5 so that the field between the touch driving line 4 and the touch sensing line 5 can penetrate the touch sensing electrode layer to reach the outside of the second substrate 2, ant thus the touch action occurring outside of the second substrate 2 can be sensed better.

When the touch panel is in operation, the constant voltage on each of the touch sensing lines 5 is always present, and the touch driving signal on each touch driving line 4 is input as a pulse signal. When the touch scanning TFT 6 connected to the touch driving line 4 is turned on, a touch driving signal is input to the touch driving line 4 by the touch driving circuit. The turning-on and turning-off of the touch scanning TFT 6 is controlled by the gate line 3 connected to the touch scanning TFT 6; when the chip IC for controlling the display of an image scans a gate line 3, i.e., applies a display driving voltage to the gate line 3, all the TFTs (including the touch scanning TFT 6) connected to the gate line 3 are turned on.

When realizing the display of an image, the speed for scanning each of the gate lines is very fast, and thus the gate line is turned on very frequently in a unit time; correspondingly, the touch scanning TFT 6 is turned on very frequently, and thus requirements for the touch panel to achieve a touch function can be satisfied.

Figure 5:
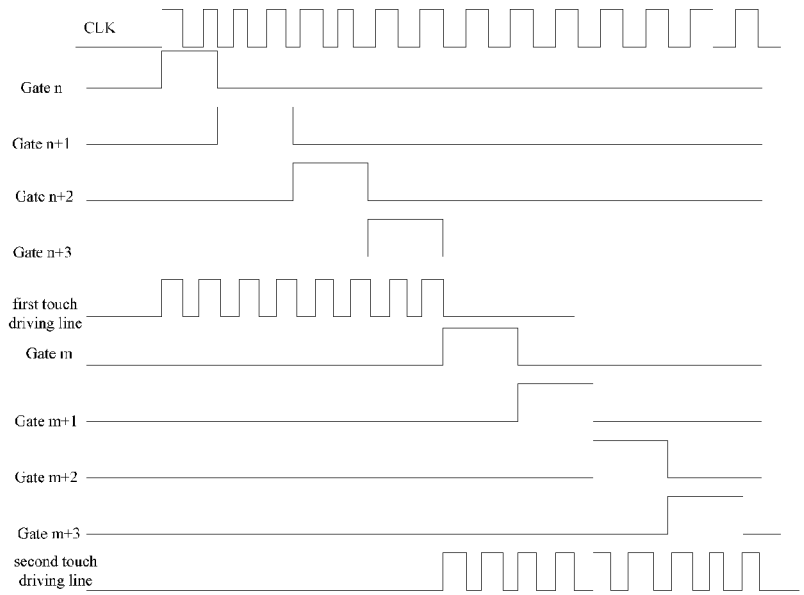
FIG. 5 is a timing sequence diagram of signals when an image is displayed and a touch detecting is performed in the in-cell touch panel provided in the embodiment of the present disclosure.

FIG. 5 is a timing sequence diagram of signals when achieving the display of an image and the touch function according to in the embodiments of the present disclosure.

The principle of the touch panel provided in the present disclosure to achieve the touch display function is illustrated in detail with reference to FIGS. 2 to 5.

When a gate line is scanned to achieve the display of an image, within one scanning cycle (or one scanning pulse), one or more CLK pulse signals can be input to the touch driving line 4 connected to the gate line by the touch driving IC in FIG. 4.

As shown in FIG. 5, CLK signal is the touch driving signal provided by the touch driving I FIG. 5 shows that the touch driving IC inputs two CLK signal pulses to the touch driving line 4 at a certain time interval. Moreover, as shown in FIG. 5, the gate line n, gate line n+1, gate line n+2, and gate line n+3 control cooperatively a touch driving signal input to a first touch driving line; the gate line m, gate line m+1, gate line m+2, and gate line m+3 control cooperatively a touch driving signal input to a second touch driving line.

It should be noted that, in general within a scanning cycle for scanning the gate line, inputting two CLK signal pulses to the touch driving line 4 at a certain time interval can achieve a better touch detecting effect; within one scanning cycle, the more CLK signal pulses are input, the higher the scanning frequency of the touch driving line is, and thus the touch detecting effect is better; while accordingly the requirements for the touch driving IC increase, and thus the cost for manufacturing the whole in-cell touch panel increases.

The turning-on of the touch scanning TFT 6 has no influence on the normal operations of other TFTs on the gate line connected to the touch scanning TFT 6 for realizing the display of an image.

In the embodiments of the present disclosure, it utilizes a turn-on voltage applied to a gate line when the gate line is scanned in the prior art to turn on a touch scanning TFT 6 connected to the gate line, while a touch driving signal is input to a touch driving line connected to the touch scanning TFT 6; and thus, the touch function is achieved by the touch driving line to which the touch driving signal is applied and the touch sensing line to which the constant voltage is applied.

The touch driving line 4 is arranged on the first substrate 1, and the touch sensing line 5 can be arranged on the first substrate 1 or second substrate 2.

The embodiments of the present disclosure can be applied to the field of Liquid Crystal Display and the field of other displays as well, such as the field of electroluminescent Organic Light Emitting Diode (OLED).

Figure 6:
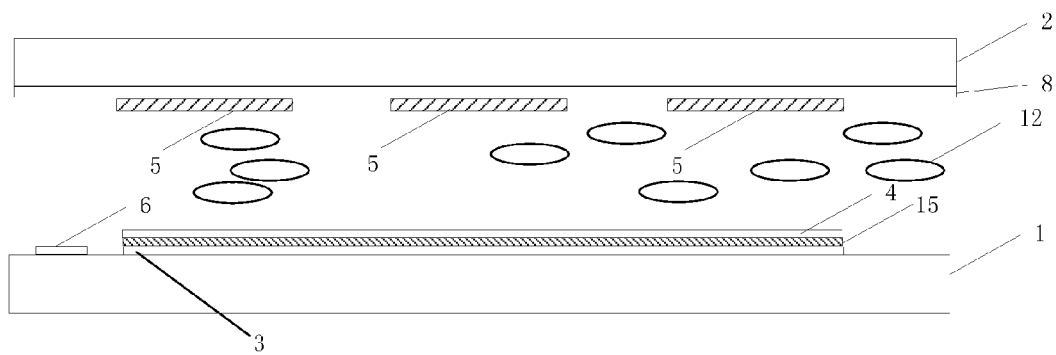
FIG. 6 is a schematic diagram showing a structure of an arrangement of touch sensing lines in the in-cell touch panel provided in the embodiment of the present disclosure.
Figure 7:
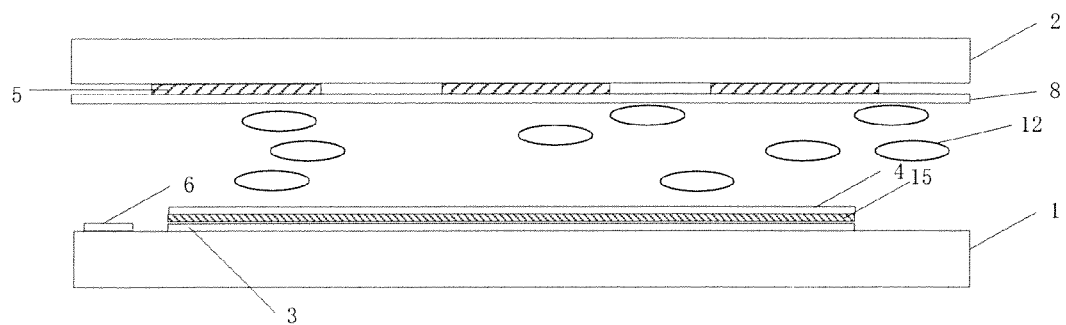
FIG. 7 is a schematic diagram showing a structure of another arrangement of touch sensing lines in the in-cell touch panel provided in the embodiment of the present disclosure.

When the embodiments of the present disclosure are applied to the field of Liquid Crystal Display, the touch driving lines 4 are arranged on an array substrate (corresponding to the first substrate 1), and the touch sensing lines can be arranged on a color film substrate (corresponding to the second substrate 2). In particular, as shown in FIG. 6, the touch sensing lines can be arranged on the side of the second substrate 2 contacting the liquid crystal, particularly the touch sensing lines can be arranged together with transparent electrode on a same layer, i.e., on the top of a RGB resin layer 8. In an example, the transparent electrode on the second substrate 2 can be ITO common electrode (in the case of TN type of LCD) or the ITO shield electrode for electrostatic shielding (in the case of IPS type or FFS type of LCD). As an alternative, as shown in FIG. 7, the touch sensing lines can be also arranged between the RGB resin layer 8 and the second substrate 2.

When the embodiments of the present disclosure are applied to the field of OLED display, the touch driving lines 4 and the touch sensing lines 5 can be arranged together on different layers on the first substrate or the second substrate of the in-cell touch panel.

The number of the gate lines for the touch panel can be set according to the requirements for the touch accuracy and the size of the touch panel. When the requirements for the touch accuracy are relatively higher and/or the size of the touch panel is larger, more gate lines can be arranged on the array substrate to achieve the touch function; while the requirements for the touch accuracy are relatively lower and/or the size of the touch panel is smaller, less gate lines can be arranged on the array substrate to achieve the touch function. The touch driving signals are applied to the touch driving lines by controlling all the gate lines or a part of the gate lines on the first substrate 1. All the gate lines connected to the touch scanning TFT 6 can control the touch scanning TFT 6 to be turned on or turned off, and further control the time during which the touch driving signals are applied to the touch driving lines, that is, controlling the scanning time of each touch driving line.

Figure 8:
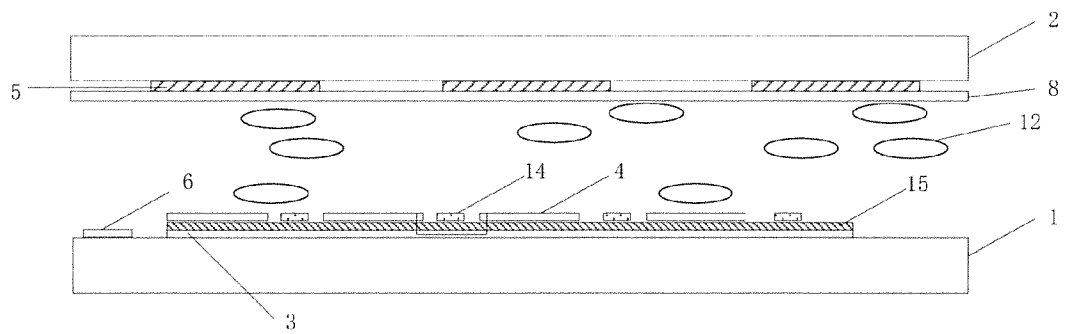
FIG. 8 is a schematic diagram showing a structure in which data lines and the touch sensing lines are arranged on the same layer in the in-cell touch panel provided in the embodiment of the present disclosure.

In an example, as shown in FIG. 8, the in-cell touch panel as provided in an embodiment of the present disclosure further comprises: a plurality of data lines 14 arranged vertically on the first substrate 1; a plurality of touch driving lines 4 arranged horizontally on the first substrate 1, wherein the touch driving lines 4 can be arranged on a same layer as the data lines 14 on the first substrate 1 as shown in FIG. 6, and can be also arranged as a separate layer; a plurality of touch sensing lines 5 arranged on a same layer as transparent electrodes on the second substrate 2.

Wherein the touch driving lines 4 can be arranged on the same layer as the data lines 14 on the first substrate 1, so that the touch driving lines 4 and the data lines 14 can be manufactured in a same process, which saves the process flow and simplifies the process procedure. However, it requires that the data lines 14 and the touch driving lines 4 are isolated from each other in the process of manufacturing, to avoid the issue that there is a short-circuit formed between the data lines 14 and the touch sensing lines 4 or there is a crosstalk between signals.

The touch driving lines 4 can be arranged as a separate layer and is isolated from the data lines 14 via an isolated layer, which can completely avoid the issue of the short-circuit or crosstalk formed between the touch driving lines 4 and the data lines 14, wherein a film layer on which the touch driving lines 14 are located can be arranged on the top of a film layer on which the data lines 14 are located.

When the touch driving lines 4 are arranged on a same layer as the data lines 14 on the first substrate 1, in order to avoid the issue of crosstalk formed with the data lines, in an example as shown in FIG. 8, each touch driving line 4 includes a plurality of touch driving line segments, each of which locates between two adjacent data lines 14, and the touch driving segments located on two sides of a same data line 14 can be connected by through hole bypass.

In particular, the connection can be carried out by through hole bypass as follows: the touch driving segments on the both sides of the same data line 14 can be connected through connecting electrodes located on the gate metal layer or located on the Indium Tin oxide ITO pixel electrode layer, and the connecting electrodes are connected to the touch driving line segments on the both sides of the same data line by through holes respectively.

The touch scanning TFT on one gate line can control the touch driving signal to be input to a touch driving line, or the touch scanning TFTs on a plurality of gate lines can control the touch driving signal to be input to a same touch driving line. That is, each touch driving line is connected to a drain of one touch scanning TFT, or each touch driving line is connected to drains of a plurality of touch scanning TFTs.

As shown in FIG. 3, one touch driving line 4 of the in-cell touch panel is connected to 4 touch scanning TFTs 6, and when the touch scanning TFTs 6 connected to the touch driving line 4 are turned on in sequence, the touch scanning TFTs 6 connected to the touch driving line 4 input a touch driving signal to the same touch driving line 4 sequentially.

Controlling the input of the touch driving signal to the same touch driving line by the touch scanning TFTs on a plurality of gate lines can increase the number for charging the touch driving line in unit time, i.e., the number of input of the touch driving signal; the more the number for charging the touch driving line in unit time is, the better the effect of the touch sensing is, and thus the touch accuracy is higher.

As shown in FIG. 2, the touch driving line is narrow in width. In order to realize the normal touch function, in an embodiment of the disclosure, the touch driving line for realizing the touch function is optimized in structure.

Figure 9:
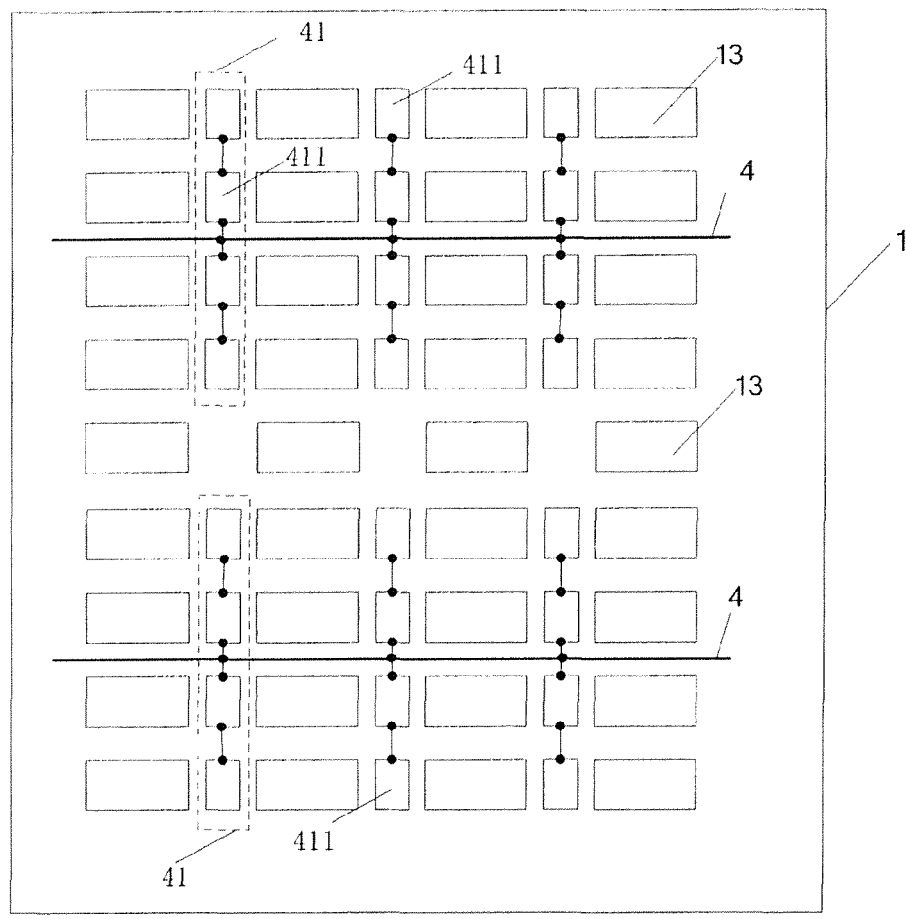
FIG. 9 is a schematic diagram showing a particular structure of touch driving lines in the in-cell touch panel provided in the embodiment of the present disclosure.

In particular, with reference to FIG. 9, the in-cell touch panel provided in the disclosure further comprises a plurality of touch driving electrode units 41 arranged in vertical direction, wherein each touch driving electrode unit 41 comprises one or more touch driving electrodes 411, and each touch driving electrode unit 41 is connected electrically to one touch driving line 4, and each touch driving electrode unit 41 is arranged between two adjacent columns of pixel units; that is, the touch driving electrode unit 41 is opposite to the gap between two adjacent touch sensing lines 5 on the second substrate in space.

Figure 10:
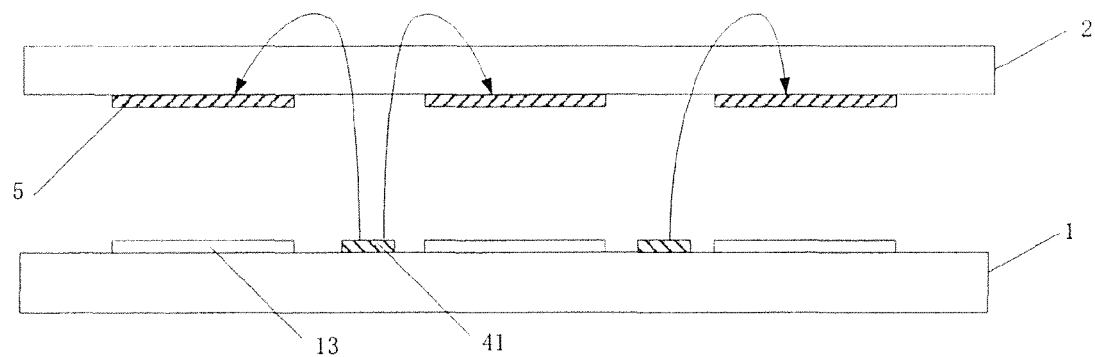
FIG. 10 is a schematic diagram showing a structure in which pixels and the touch sensing lines are arranged oppositely in the in-cell touch panel provided in the embodiment of the present disclosure.

In an example, as shown in FIG. 10, the gap between the two adjacent touch sensing lines 5 is opposite to the touch driving electrode unit 41 on the first substrate 1; that is, the gap between the two adjacent touch sensing lines 5 is opposite to the gap between the two adjacent columns of pixel units 13 on the first substrate 1; one touch sensing line 5 is opposite to one column of pixel units 13 (as shown in FIG. 10) or a plurality of columns of pixel units (not shown in FIG. 10); wherein each pixel unit includes at least three sub-pixels RGB.

In an example, a plurality of neighboring touch driving electrode units 41 are connected electrically to each other via a touch driving line 4.

In an example, the length of each touch driving electrode unit 41 is 10 μm~150 μm, and it depends on the size of the touch panel and the aperture ratio as required. If the touch panel has a larger size, the length of each touch driving electrode unit 41 can be set longer, otherwise can be set shorter.

In an example, the width of each touch driving electrode unit 41 is equal to the width of one sub-pixel unit on the array substrate, but not limited to the width of one sub-pixel unit, and it can be set according to the actual requirements. If the requirements for the aperture ratio are lower, the width of the touch driving electrode unit 41 can be set wider, otherwise, if the requirements for the aperture ratio are higher, the width can be set narrower.

In an example, each touch driving electrode 411 is located between gate lines corresponding to two adjacent sub-pixel units in vertical direction (not shown in FIG. 9). The length of each touch driving electrode 411 can be equal to the length of one sub-pixel unit or less than the length of one sub-pixel unit.

Preferably, the width of the connection part between the adjacent touch driving electrodes 411 constituting each touch driving electrode unit 41 is less than the width of touch driving electrode 411 itself; preferably, the adjacent touch driving electrodes 411 in vertical direction can be connected by a metal wire having a width equal to or close to the width of a data line or gate line, which can reduce the area of the touch driving electrode unit 41 overlapping with the gate line, and reduce the mutual-capacitance with the gate line without affecting the gate line for realizing the normal display of an image.

In an example, the touch driving electrodes located in different areas of the first substrate are equal in size, and the touch driving electrode units are identical. That is, each touch driving electrode unit has a same width and a same length, and each touch driving electrode unit includes a same number of touch driving electrodes.

In an example, the touch driving electrode unit 41 connected to a same touch driving line 4 can be arranged between every two adjacent pixel units which belong to the same row (as shown in FIG. 9), or can be arranged between a part of adjacent pixel units which belong to the same row.

In order to achieve a higher accuracy in the effect of touch sensing, preferably, the touch driving electrode unit 41 is arranged between every two adjacent pixel units which belong to a same row. In an example, to reduce the difficulty in the manufacturing process and satisfy the requirements for the accuracy of the normal touch, the touch driving electrode unit 41 is arranged between a part of adjacent pixel units which belong to a same row according to the actual requirements, wherein the distance L between the two adjacent touch driving electrode units 41 can be designed according to the actual requirements and the size of the actual in-cell touch panel.

As shown in FIG. 9, the distance between the touch driving electrode units 41 adjacent to each other in vertical direction is equal to the length of one pixel unit, or can be the sum of the lengths of two or more pixel units.

In an example, the distance between the two touch driving electrode units 41 adjacent to each other in vertical direction can be arranged according to the requirements, that is, it can be the sum of the lengths of one or more pixel units in vertical direction, or can be equal to the distance between the adjacent pixel units in a same column.

Figure 11:
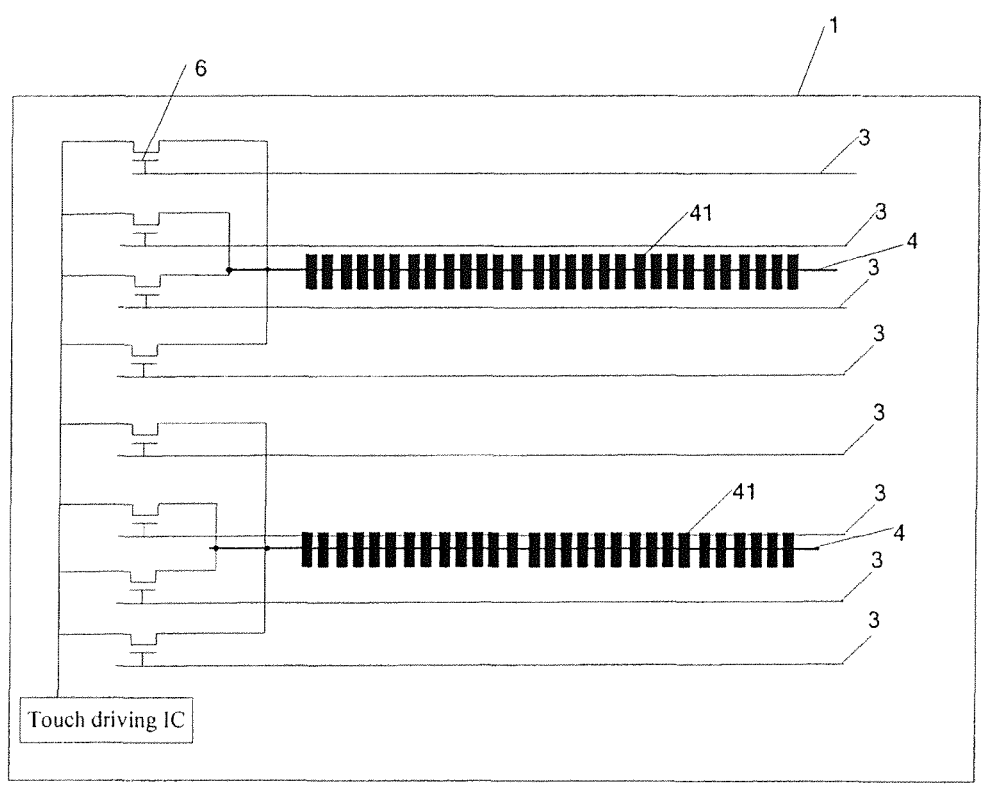
FIG. 11 is a schematic top view of another in-cell touch panel provided in the embodiment of the present disclosure.

FIG. 11 is a part of a schematic top view of an in-cell touch panel having a plurality of touch driving electrode units 41 arranged on the touch driving line 4. Seen as a whole, the touch driving lines optimized in structure are conductive bars with a certain width arranged in horizontal direction, which increases the touchable area for the touch driving lines and improves the sensibility of the touch panel.

Hereinafter, it is explained the mode in which the touch sensing lines 5 are arranged as provided in an embodiment of the disclosure.

The touch sensing lines provided in the disclosure are the transparent conductive bars, particularly they can be manufactured by Indium Tin Oxide (ITO).

Figure 12:
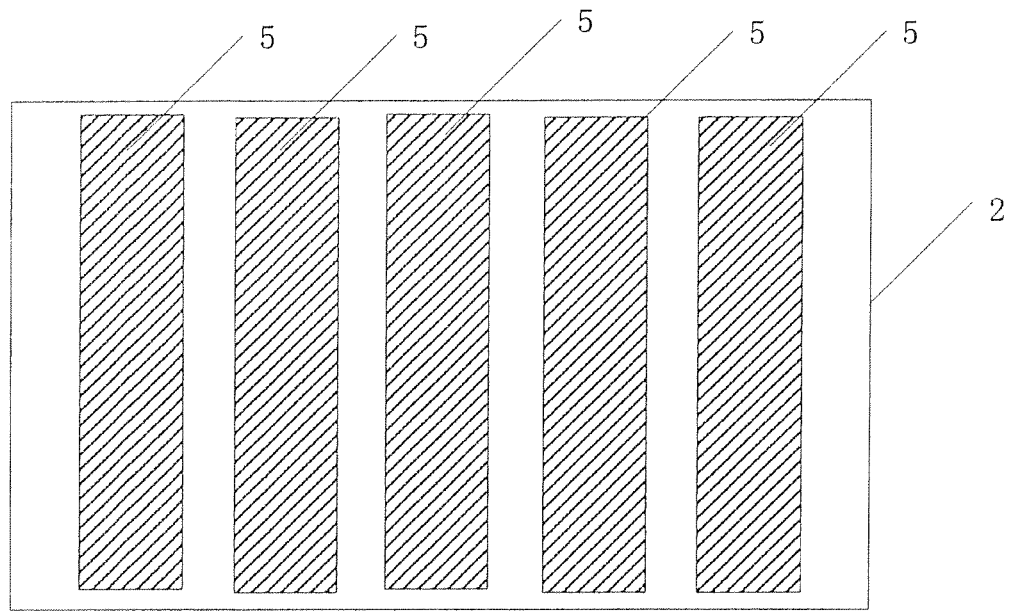
FIG. 12 is a schematic diagram showing a structure of the touch sensing lines provided in the embodiments of the present disclosure.

As shown in FIG. 12, the touch sensing lines 5 are a plurality of conductive bars having a certain width and being arranged with an equal interval therebetween.

The area where each touch sensing line 5 is located corresponds to the area where the pixel units which belong to a same column are located on the array substrate; that is, the projective area of each touch sensing line 5 on the array substrate overlaps with the area covered by the pixel units which belong to a same column under the touch sensing line.

Figure 13:
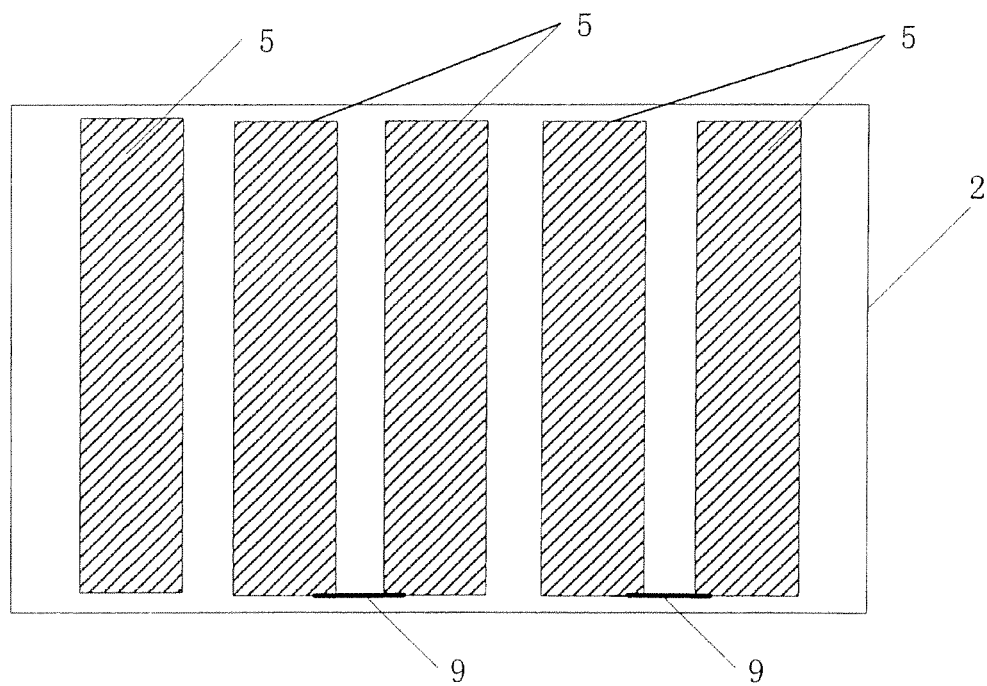
FIG. 13 is a schematic diagram showing another structure of the touch sensing lines provided in the embodiments of the present disclosure.

In an example, with reference to FIG. 13, a part of the neighboring touch sensing lines 5 are connected via a wire 9 to improve the signal reception of the touch sensing lines; for example, three or two neighboring conductive bars are connected together via a wire 9. Thus, a plurality of independent touch sensing lines 5 connected via the wire 9 constitute a wider touch sensing line.

As shown in FIG. 12 and FIG. 13, the width of the touch sensing line can be equal to the width of one pixel unit, and can be also equal to the sum of the widths of a plurality of pixel units; that is, the touch sensing line 5 covers only one column of pixel units or a plurality of columns of pixel units adjacent to each other in sequence. When the touch sensing line 5 covers a plurality of columns of pixel units adjacent to each other in sequence, the signal reception of the touch sensing line is improved.

In an example, the touch driving circuit connected to the source of each touch scanning TFT 6 and the driving circuit for driving the gate line to realize the display of an image can be arranged in an Integrated Chip IC. The CLK signal provided to the touch driving line is independent of the driving signal for realizing the display of an image.

In summary, in the embodiments of the disclosure, an in-cell touch panel includes a plurality of gate lines arranged horizontally, a plurality of touch driving lines arranged horizontally, and a plurality of touch sensing lines arranged vertically; and the in-cell touch panel further comprises: a plurality of touch sensing Thin Film Transistors (TFTs) corresponding to the gate lines one to one respectively; wherein the gate of each touch scanning TFT is connected to the gate line corresponding to the touch scanning TFT, and the source thereof is connected to the touch driving circuit, and the drain thereof is connected to one touch driving line. When a driving signal for realizing the display of an image is applied to the gate line connected to the touch scanning TFT, the touch scanning TFT is turned on; then the touch driving signal is applied to the touch scanning TFT and the touch driving line connected to the drain of the touch scanning TFT is driven. The touch function of the in-cell touch panel is achieved by the electric field formed by the touch driving line to which the touch driving signal is applied and the touch sensing line. Thus, an in-cell touch panel with a simple structure and a low cost can be implemented.

Obviously, those skilled in the art can make various modifications and variants to the embodiments of the disclosure without departing from the scope and the spirit of the disclosure. Thus, provided that these modifications and variants belong to the scope of the claims of the disclosure and their equivalences, these modifications and variants are intended to be contained in the disclosure.

What is claimed is:

1. An in-cell touch panel, comprising:
    a first substrate and a second substrate arranged oppositely, wherein a plurality of gate lines arranged horizontally are formed on the first substrate, wherein, the in-cell touch panel further comprises:
    a plurality of touch driving lines arranged horizontally;
    a plurality of touch sensing lines arranged vertically; and
    a plurality of touch scanning TFTs, wherein each touch scanning TFT has a gate connected to one gate line, a source connected to a touch driving circuit, and a drain connected to one touch driving line, the one gate line is only connected to the gate of one touch scanning TFT;
    wherein, the number of the gate lines≥the number of the touch scanning TFTs≥the number of the touch driving lines.

2. The in-cell touch panel of claim 1, wherein each touch driving line is connected to one or more touch scanning TFTs via drains of the one or more touch scanning TFTs.

3. The in-cell touch panel of claim 1, wherein the gate lines, corresponding to a plurality of touch scanning TFTs connected to one touch driving line, are adjacent to each other.

4. The in-cell touch panel of claim 1, wherein the in-cell touch panel further comprises a plurality of data lines arranged vertically on the first substrate;
    the plurality of touch driving lines are located on the first substrate, and are arranged on a same layer as the data lines; each of the plurality of touch driving lines comprises a plurality of driving segments, each of which locates between two adjacent data lines; the driving segments located on both sides of a same data line are connected to each other by through hole bypass; and
    the plurality of touch sensing lines are located on the second substrate.

5. The in-cell touch panel of claim 1, wherein the touch scanning TFTs are arranged in a non-display area of the first substrate.

6. The in-cell touch panel of claim 1, wherein the in-cell touch panel further comprises:
    a plurality of touch driving electrode units arranged vertically, wherein each of the plurality of touch driving electrode units includes one or more touch driving electrodes, and each of the touch driving electrode units is connected electrically to one of the touch driving lines, the touch driving electrode unit is arranged between two adjacent columns of pixel units.

7. The in-cell touch panel of claim 6, wherein the gap between adjacent touch sensing lines is opposite to the touch driving electrode unit on the first substrate; each of the touch sensing lines is opposite to one or more columns of pixel units.

8. The in-cell touch panel of claim 6, wherein within each of the touch driving electrode units, a plurality of neighboring touch driving electrodes are electrically connected to each other via a metal wire having a same width as the gate line or the data line.

9. The in-cell touch panel of claim 6, wherein the length of each touch driving electrode unit is 10 μm~150 μm.

10. The in-cell touch panel of claim 6, wherein the width of each touch driving electrode unit is equal to the width of a sub-pixel unit on an array substrate.

11. The in-cell touch panel of claim 6, wherein each touch driving electrode unit is located between the gate lines corresponding to two sub-pixel units adjacent to each other vertically.

12. The in-cell touch panel of claim 1, wherein the touch driving circuit connected to the source of each touch scanning TFT and a driving circuit for driving the gate lines to realize the display of an image are arranged in an integrated chip.

* * * * *